United States Patent
Chan et al.

(10) Patent No.: US 6,922,097 B2
(45) Date of Patent: Jul. 26, 2005

(54) ASYMMETRIC-AMPLITUDE DUAL-POLARITY CHARGE PUMP WITH FOUR-PHASE SELECTABLE OPERATION

(75) Inventors: Paul Shu Huen Chan, Cupertino, CA (US); Zhen Qin Luo, Shanghai (CN); Shun Fang Wu, Shanghai (CN); Jian Qiang Pan, Shanghai (CN)

(73) Assignee: Pericom Technology Co. Ltd. (Shanghai), San Jose, CA (US)

( * ) Notice: Subject to any disclaimer, the term of this patent is extended or adjusted under 35 U.S.C. 154(b) by 0 days.

(21) Appl. No.: 10/710,062

(22) Filed: Jun. 16, 2004

(65) Prior Publication Data

US 2005/0024962 A1 Feb. 3, 2005

(30) Foreign Application Priority Data

Jul. 30, 2003 (CN) .......................................... 03141948 A

(51) Int. Cl.[7] .............................................. G05F 3/02
(52) U.S. Cl. ......................... 327/536; 327/537; 363/60
(58) Field of Search ................................. 327/536, 537; 363/59, 60

(56) References Cited

U.S. PATENT DOCUMENTS

| | | | | |
|---|---|---|---|---|
| 3,824,447 A | * | 7/1974 | Kuwabara | 363/60 |
| 4,797,899 A | | 1/1989 | Fuller et al. | 375/219 |
| 4,807,104 A | * | 2/1989 | Floyd et al. | 363/59 |
| 4,812,961 A | * | 3/1989 | Essaff et al. | 363/61 |
| 4,999,761 A | | 3/1991 | Bingham et al. | 363/60 |
| 5,041,739 A | * | 8/1991 | Goto | 327/536 |
| 5,051,882 A | * | 9/1991 | Grimm et al. | 363/60 |
| 5,126,590 A | | 6/1992 | Chern | 327/536 |
| 5,237,209 A | * | 8/1993 | Brewer | 363/60 |
| 5,262,934 A | * | 11/1993 | Price | 363/60 |
| 5,301,097 A | | 4/1994 | McDaniel | 363/60 |
| 5,306,954 A | | 4/1994 | Chan et al. | 307/110 |
| 5,359,294 A | * | 10/1994 | Ganger et al. | 327/554 |
| 5,422,586 A | | 6/1995 | Tedrow et al. | 327/306 |
| 5,432,469 A | | 7/1995 | Tedrow et al. | 327/306 |
| 5,461,557 A | * | 10/1995 | Tamagawa | 363/60 |
| 5,469,110 A | | 11/1995 | Liao | 327/536 |
| 5,532,916 A | * | 7/1996 | Tamagawa | 363/62 |
| 5,581,454 A | * | 12/1996 | Collins | 363/59 |
| 5,592,115 A | | 1/1997 | Kassapian | 327/239 |
| 5,606,491 A | | 2/1997 | Ellis | 363/60 |
| 5,668,710 A | | 9/1997 | Caliboso et al. | 363/60 |
| 5,920,470 A | | 7/1999 | Jin | 363/60 |
| 5,943,226 A | | 8/1999 | Kim | 363/60 |
| 5,973,979 A | | 10/1999 | Chang et al. | 365/226 |
| 6,023,188 A | | 2/2000 | Lee et al. | 327/536 |
| 6,147,547 A | | 11/2000 | Ogura et al. | 327/536 |
| 6,385,065 B1 | | 5/2002 | Roohparvar et al. | 363/60 |
| 6,512,411 B2 | | 1/2003 | Meng et al. | 327/536 |

* cited by examiner

Primary Examiner—Terry D. Cunningham
(74) Attorney, Agent, or Firm—Stuart T. Auvinen

(57) ABSTRACT

A symmetric dual-voltage charge pump and its control circuit generate bipolar output voltages. The charge pump converts a unipolar power source to a set of dual-voltage outputs of opposite polarity that are completely independent of each other. The charge pump includes two voltage-boosting transfer capacitors and two output capacitors. Two-phase operation generates an increased-magnitude output voltage of a negative polarity and another two phases of operation generate an increased output voltage of a positive polarity. The charge pump selectively charges one or both of the bipolar outputs with individual 2-phase charge cycles or with a sequence of charge cycles. When controlled by comparators with unequal reference voltages, the charge pump can force the bipolar outputs to unequal positive and negative voltages. Charge pumping is faster since only 2 phases are needed for charging either the positive or negative output.

18 Claims, 10 Drawing Sheets

ASYMMETRIC-AMPLITUDE DUAL-POLARITY CHARGE PUMP WITH FOUR-PHASE SELECTABLE OPERATION

BACKGROUND OF INVENTION

The present invention relates to charge pump circuits, and more particularly to circuitry for converting a unipolar input supply voltage to a bipolar set of output voltages.

Charge pumps have been used for decades to generate larger output voltages from an input supply voltage. Charge pumps employ capacitors and diodes or transistors that regulate current flow to and from the capacitor. A pumping action is produced as charge flows to and from the capacitor. Capacitive coupling can yield a higher output voltage than the input voltage. For example, the output voltage can be double the power-supply input voltage. Pumping can occur over multiple period of time known as phases.

Sometimes both a positive and a negative output voltage are needed. For example, the RS-232 interface has both a positive and a negative power supply. Dual-voltage charge pump circuits are useful for generating these dual voltages for RS232 interfaces.

There are a number of ways to generate two output voltages of opposite polarity. Some charge pump circuits first generate a positive voltage, which is double the input supply voltage, and then invert the voltage polarity to create a negative voltage output. This method of generating dual-voltage outputs is simple and requires very little circuitry, but it has problems. For example, it may take twice as long to first generate the positive and then the negative output voltages. Another problem is that both outputs are dependent upon each other, so electrical noise is passed from one output to the other.

A better method of generating bipolar output voltages from one input supply is to have two charge pump circuits that simultaneously generate two output voltages by controlling separate sets of charge and holding capacitors. In this case, the negative output voltage is generated separately from the positive output voltage although both use the same input voltage source. Because the two charge pump branches are separate and independent, they can drive larger output loads. The two independent branches also generate less cross talk and voltage noise spikes on the outputs, because the positive and negative capacitors are isolated from each other. With the addition of clocks and control circuitry, this charge pump can be programmed to generate single or dual bipolar outputs and pump larger amounts of current into one output over the other output based on changes in load demand (load balancing).

An example of prior art in charge pumps is U.S. Pat. No. 4,999,761. FIG. 1 shows operation of a charge pump with two working states or phases. When charging is required, the charge pump alternates between the first and the second working phases repeatedly. When charging is not required, the charge pump waits at phase 2. The charge pump must traverse these two phases at least two times to get V+ and V− to their required potential. Electronic switches (not shown) perform switching of charge for the different phase configurations of four capacitors 10, 12, 14, 16 (C1, CV+, C2, and CV−, respectively).

Capacitor C1 10 is fully charged to the potential of Vcc before switching to phase 1. In phase 1, the charge pump connects Vcc to the negative plate of capacitor C1 10 and at the same time connects the positive plate of capacitor C1 10 to the positive plate of capacitor CV+ 12. This has the effect of adding the potential on capacitor C1 10 to the potential on capacitor CV+ 12, doubling the voltage at capacitor CV+ 12 with respect to Vcc. The result is V+=+2Vcc.

The charge pump now switches back to phase 2 where capacitor C1 10 is again charged to the potential of Vcc. During this phase the switches connect the positive plate of capacitor CV+ 12 to the positive plate of capacitor C2 14, which transfers the charge from capacitor CV+ 12 to capacitor C2 14. The result is that the voltage on capacitor C2 14 is +2Vcc.

When the charge pump switches back to phase 1 the switches connect the positive plate of capacitor C2 14 to ground and the negative plate of capacitor C2 14 to the negative plate of capacitor CV− 16. This causes the voltage potential across capacitor C2 14 to appear as a negative potential with respect to Vcc. At this point the negative potential on capacitor C2 14 is added to the negative potential on capacitor CV− 16, doubling the voltage at capacitor CV− 16 with respect to Vcc. The result is an output V− equal to −2Vcc. The charge pump must continuously alternate between phase 1 and phase 2 to keep V+ and V− at a potential of 2Vcc.

The flow chart in FIG. 1 illustrates the charge pump switch pattern. During the charge cycle, the first phase 18 is always followed by the second phase 28 until the outputs reach full potential. When both outputs are fully charged, step 30, the charge pump remains in second phase 28. When the load on outputs V+ and/or V− cause degradation in output amplitude, the charge pump starts the charging cycle again.

One of the disadvantages of this charge pump is that all four capacitors must be used in sequence to obtain the correct output voltage. This method wastes energy when only one of the two output voltages requires charging. This charge pump must go through a complete cycle to charge both output voltages even though only one output voltage may have become degraded. Another problem with this type of charge pump is the loss of power from one capacitor to another. This charge pump uses a bucket brigade method of passing charges from capacitor C2 14 to capacitor CV− 16 to get V− to its charged state. The total voltage passed from V+ to V− is less than V+ because of leakage in capacitor C2 14. This results is $|V-|\leq|V+|$. This difference can be verified by measuring and comparing the two outputs V+ and V− under load.

The charge pump described as prior art in U.S. Pat. No. 5,306,954 uses a different voltage shifting method to transfer charges to outputs V+ and V−. FIG. 2 shows operation of a four-phase charge pump. Unlike the prior art charge pump described in FIG. 1, the negative bipolar output voltage is not generated from the positive bipolar output voltage. Instead, the negative and positive bipolar output voltages are each generated, in substantially the same manner, using a symmetrical charge transfer technique illustrated by the four phases in FIG. 2. Electronic switches (not shown) create the switching configurations shown in phases 1, 2, 3 and 4 of four capacitors C1 20, C2 22, CV+ 24 and CV− 26.

Phase four is the idle state for this charge pump. At this point V+ and V− are at their peak charge and capacitor C1 20 has a potential equal to Vcc. When V+ or V− needs charging, charge pump circuitry goes through the first, second, third and fourth phases in circular manner. In phase 1 the negative plate of capacitor C1 20 is connected to the negative plate of capacitor C2 22. In this configuration, the potential of capacitor C1 20 is added to capacitor C2 22 making the voltage on capacitor C2 22=2Vcc. In phase 2 capacitor C1 20 is charged again to a potential equal to Vcc. At the same time the charge on capacitor C2 22 is transferred to capacitor CV− 26. However the charge pump switches have reversed the poles on capacitor C2 20 so that the positive plate of capacitor C2 20 is grounded and the negative plate of capacitor C2 20 is connected to the negative plate of capacitor CV− 26. The result is output V−=−2Vcc. Note that capacitor C2 22 and capacitor CV+ 24 have swapped positions in the diagram for phases 2, 4 relative to their positions in phases 1,3.

In phase 3 the switches connect the positive plate of capacitor C1 20 to ground and the negative plate of capacitor C1 20 to the negative plate of capacitor C2 22. Because the positive plate of capacitor C2 22 is connected to Vcc, now capacitor C2 22=2Vcc. In phase four capacitor C1 20 is back to its normal configuration, charged to a potential equal to Vcc. At the same time the charge pump switches have connected capacitor CV+ 24 to capacitor C2 22 allowing capacitor C2 22 to transfer its charge to capacitor CV+ 24. The result is output V+=+2Vcc. The charge pump repeats these four phases whenever V+ or V− falls below the minimum charge requirement.

FIG. 3 is a flowchart of the four phases illustrated in FIG. 2. Phase 4 38 is also the idle state. When the charge pump detects that outputs V+ or V− have become degraded, decision 48 is made to begin the charge cycle by entering phase 1 32. In phase 1 32, capacitors are charged to a value equal to 2Vcc. In phase 2 34, the polarity of the charge is reversed and then passed to a holding capacitor leaving output V−=−2Vcc. In phase 3 36, capacitors are again charged to a value equal to 2Vcc. In phase 4 38, the charge built up in phase 3 36, is passed to a holding capacitor leaving output V+=+2Vcc.

This version of charge pump may be considered better than the charge pump described in FIG. 1 because two separate branches are used to obtain the final values of V+ and V−. This method allows the amplitude of |V+| and |V−| to match. However, this method of generating bipolar charges still uses a sequential charge path with a cycle that cannot be changed. If only one of the two outputs, V+ or V−, require charging, the complete charge cycle must be executed, consuming unnecessary power. A better method is to have control circuitry that allows the charge pump to build up charge on V+ or V− separately as load demand changes. Another improvement is to have control circuitry that allows the charge pump to build up unequal voltage potentials on V+ and V−.

DETAILED DESCRIPTION

The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Two charge pump circuits generate independent output voltages from one input voltage source. Two sets of charge and holding capacitors allow the negative output voltage to be generated separately from the positive output voltage. Two separate and independent charge pump branches are more efficient in supporting output loads and generate less cross talk because the output capacitors are isolated from each other. With the addition of clocks and control circuitry, the charge pump can charge single or dual outputs and pump larger amounts of current into one output over the other output based on load demand. With the addition of comparator circuits, this invention can also generate unequal output voltages.

Figure 1:
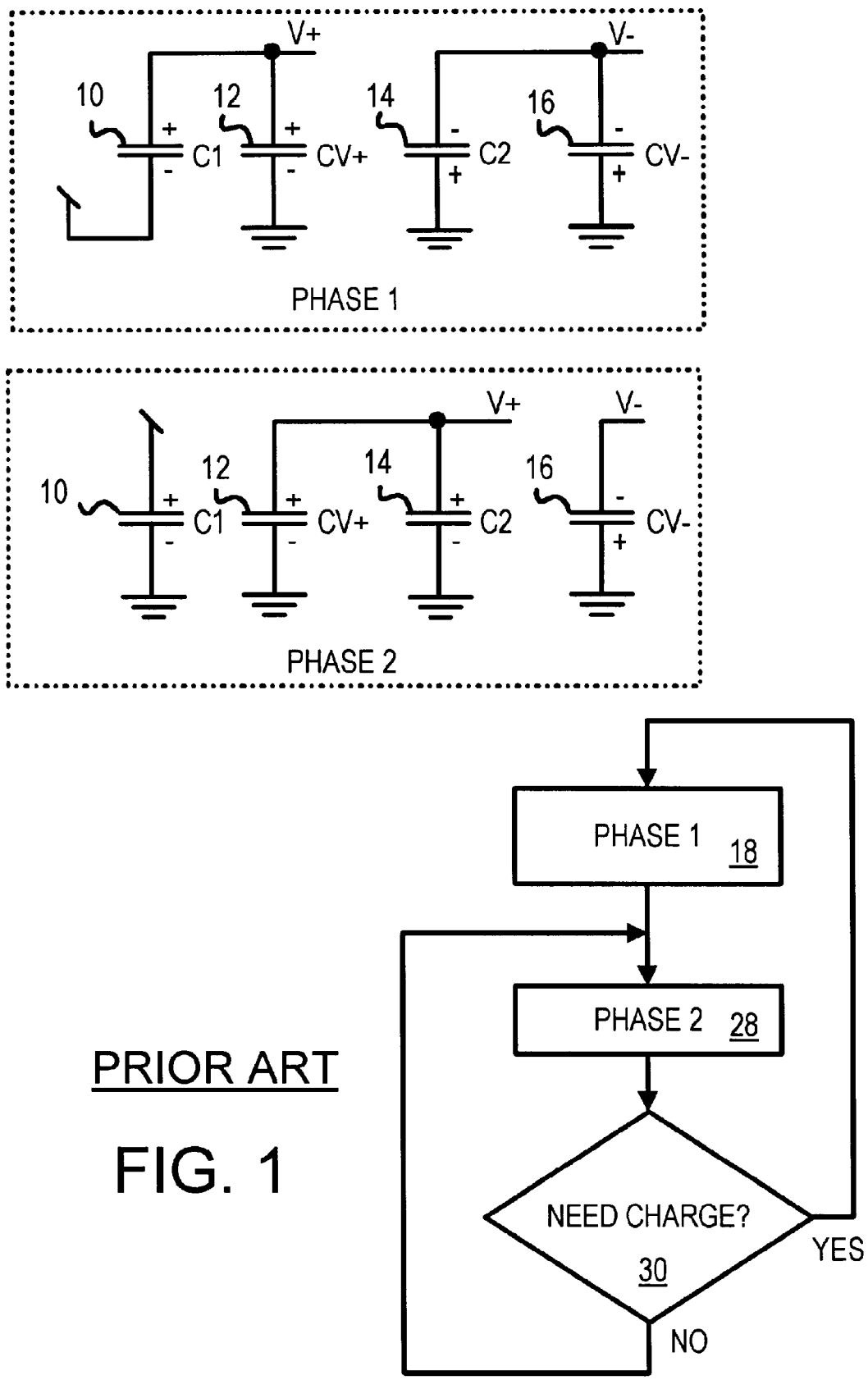
FIG. 1 shows operation of a charge pump with two working states or phases.
Figure 2:
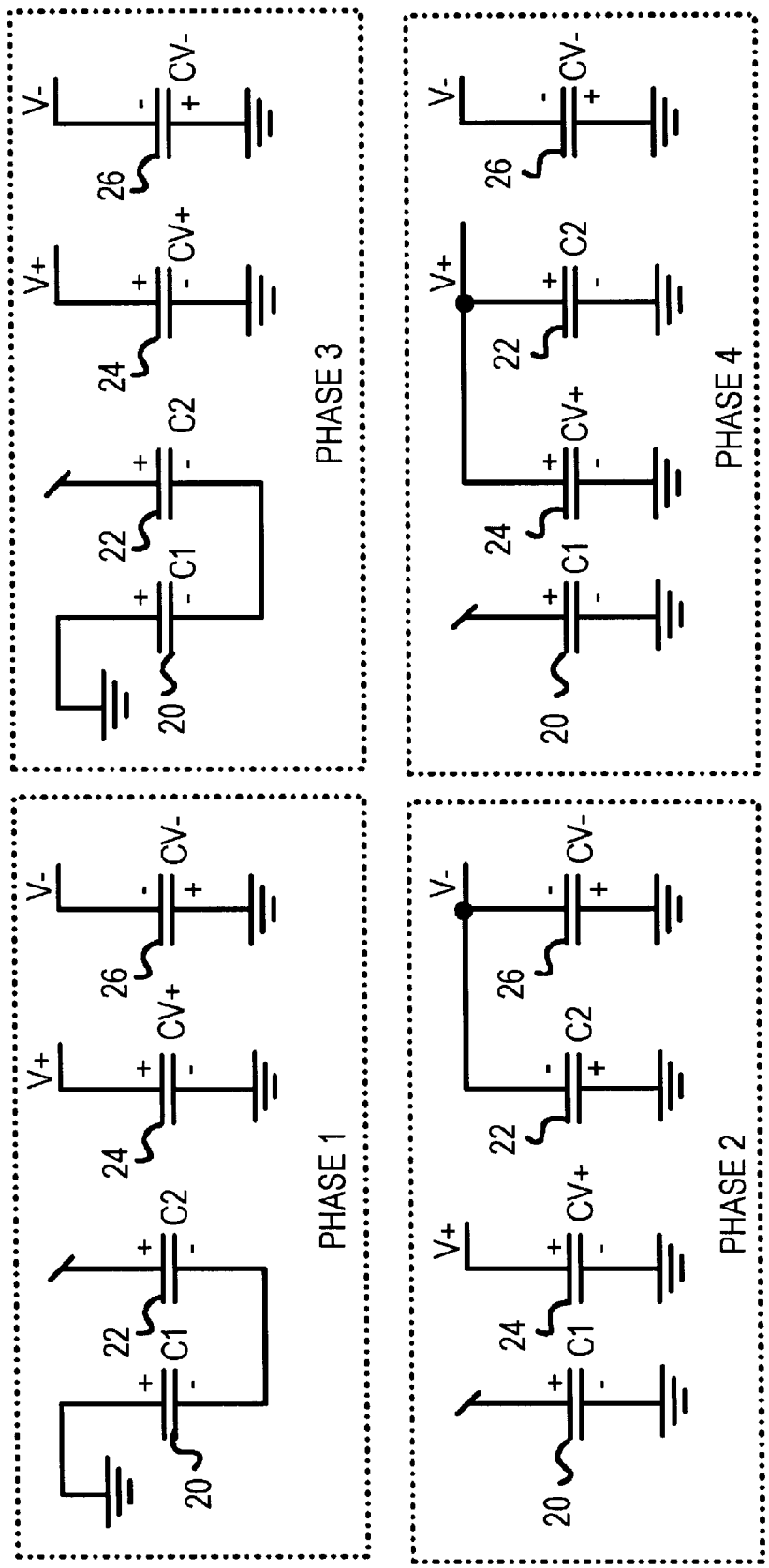
FIG. 2 shows operation of a four-phase charge pump.
Figure 3:
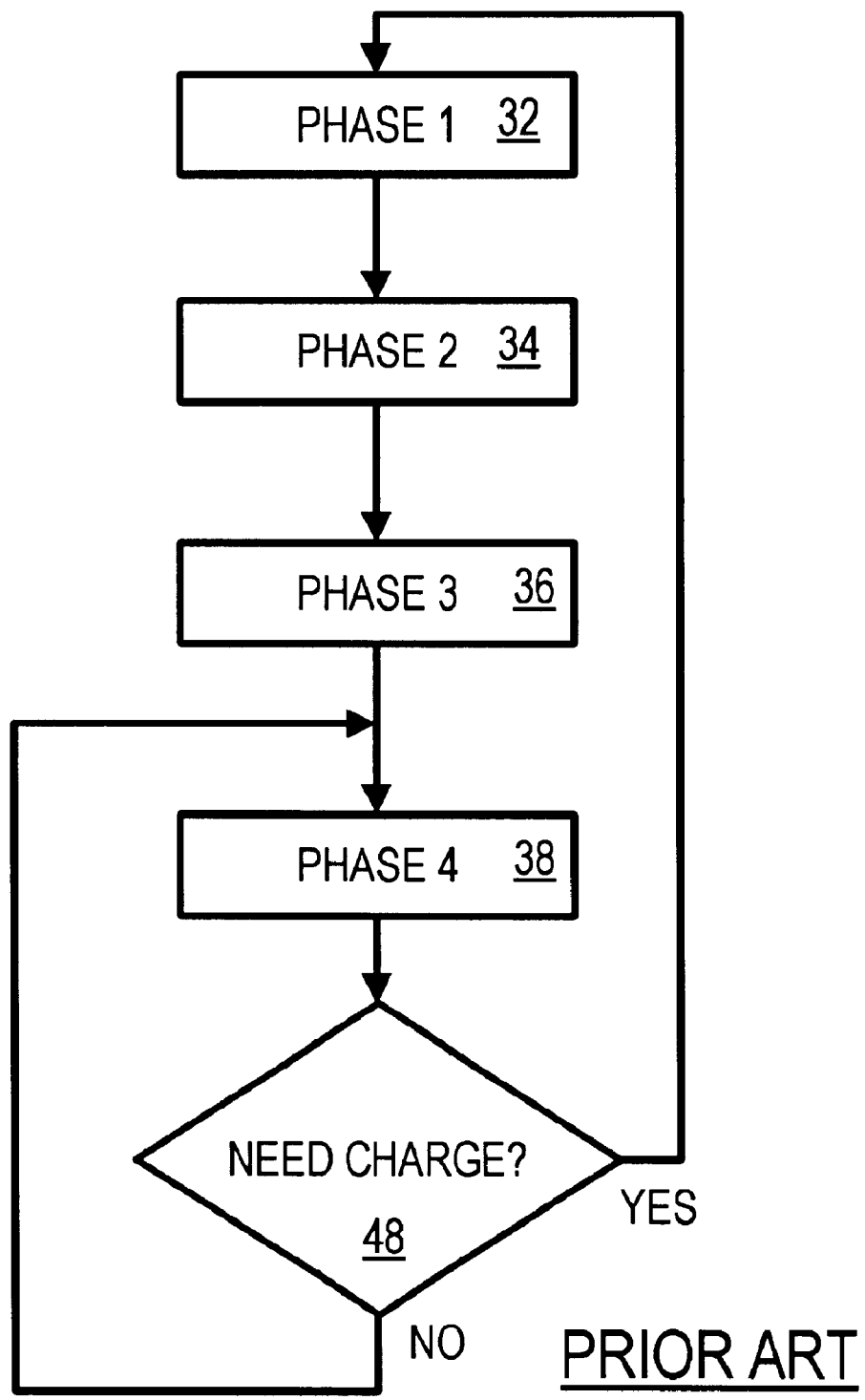
FIG. 3 is a flowchart of the four phases illustrated in FIG. 2.
Figure 4:
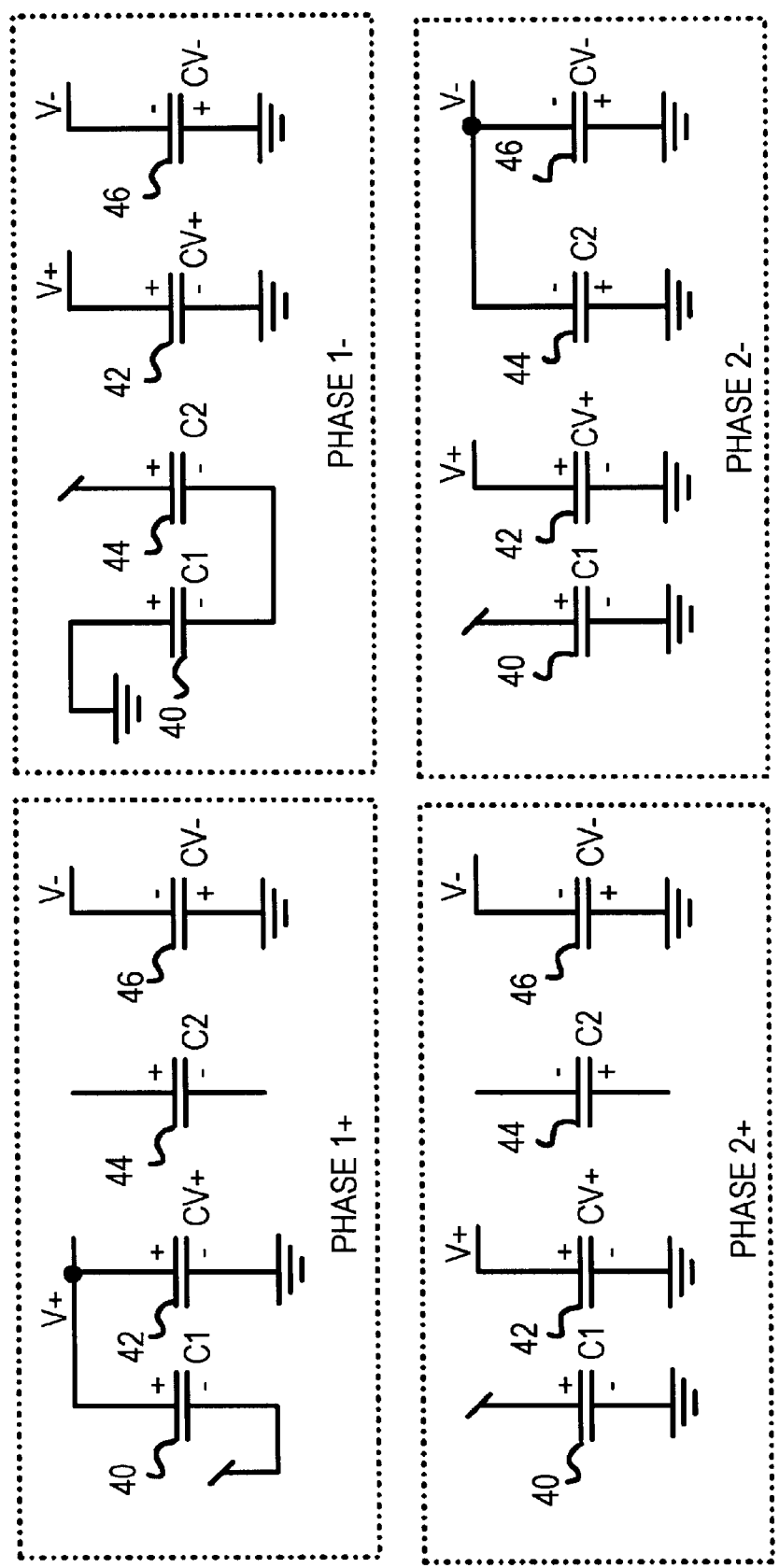
FIG. 4 illustrates four phases of a dual 2-phase charge pump.

FIG. 4 illustrates four phases of a dual 2-phase charge The four phases 1+, 2+, 1−, and 2− are not necessarily sequential. Instead, there are two separate phases for each charged output. Phases 1+ and 2+ are for charging V+, while phases 1− and 2− are for charging V−. Phase 2 is the idle phase for both V+ and V− outputs. In the case of the V+ output, during phase 2+, capacitor C1 40 is fully charged to the potential of Vcc. When the amplitude of V+ degrades, the charge pump switches to phase 1+, wherein the negative plate of capacitor C1 40 is connected to Vcc and the positive plate of capacitor C1 40 is connected to the positive plate of capacitor CV+ 42. This has the effect of adding the charges on capacitor C1 40 and capacitor CV+ 42 together making V+=2Vcc. The charge pump then switches back to phase 2+, charging capacitor C1 40 once again. Charge is pumped from capacitor C1 40 to capacitor CV+ 42 to raise or maintain V+.

In the case of the V− output, during phase 2−, capacitor C1 40 is fully charged to the potential of Vcc. When the amplitude of V− degrades, the charge pump switches to phase 1− wherein the positive plate of capacitor C1 40 is connected to Vcc and the negative plate of capacitor C1 40 is connected to the negative plate of capacitor C2 44. This has the effect of adding the charges on capacitor C1 40 and capacitor C2 44 together making the combined potential equal to 2Vcc. Now the charge pump switches back to phase 2 −, charging capacitor C1 40 and transferring the charge from capacitor C2 44 to capacitor CV− 46. The result is that the voltage of output V− equals −2Vcc.

Figure 5:
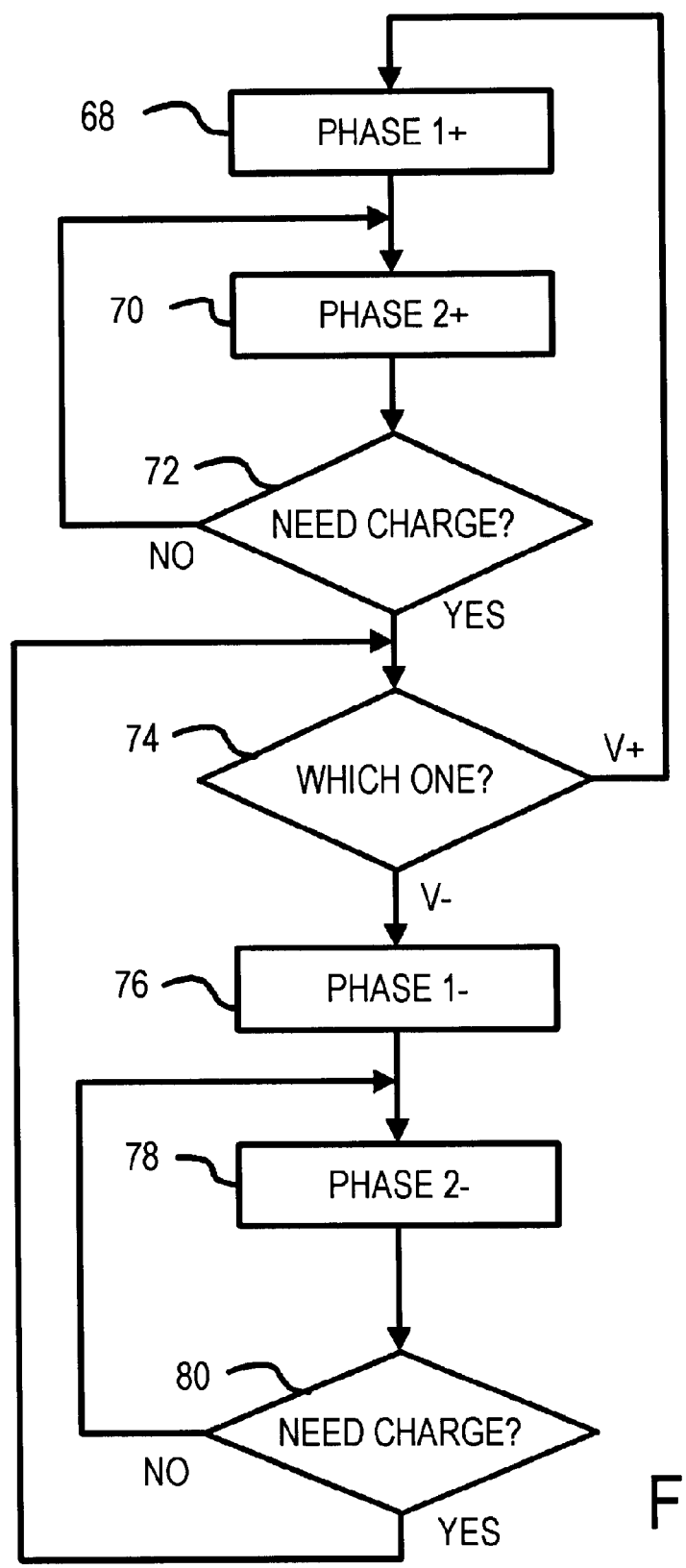
FIG. 5 is a flowchart of operation of the two separate charging paths for V+ and V− in a dual 2-phase charge pump.

FIG. 5 is a flowchart of the two separate charging paths for V+ and V− in a dual 2-phase charge pump. Phase 2+ 70 for V+ is an idle state. If the charge pump detects a drop in V+ amplitude, it falls through decision state 72 and on to decision state 74. At this point control circuitry directs charge pump switches to enter phase 1+ 68 and connect the appropriate charge pump configuration to bring V+ to the required potential. In the case of V−, Phase 2− 78 is an idle state. If the charge pump detects a rise in V− amplitude, it falls through decision state 80 and back to decision state 74.

At this point control circuitry directs charge pump switches to enter phase 1– 76 and connect the appropriate charge pump configuration to bring V– to the required potential.

An advantage of having two separate paths is that energy is not wasted when only one output contains an active load. Another second advantage is the speed increase when charging a specific output. Only two phases are needed to charge one output, rather than four phases. Having separate paths thus allows a single output to be charged twice as fast when compared to older charge pump circuits.

Figure 6:
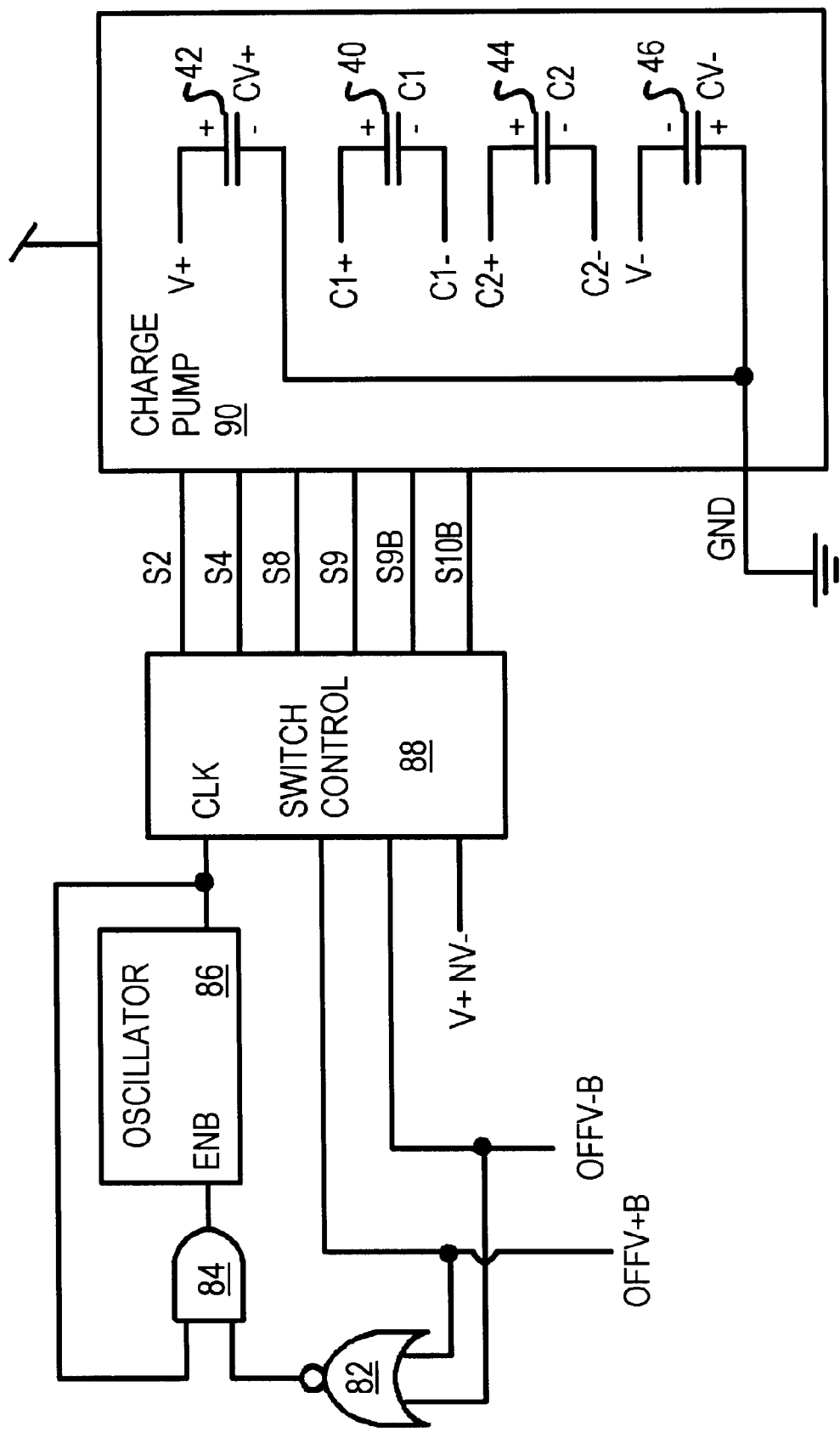
FIG. 6 is a block diagram of the dual 2-phase charge pump.

FIG. 6 is a block diagram of the dual 2-phase charge pump. There are three main blocks to this circuitry: pump signal control, switch control 88, and charge pump 90.

Pump signal control includes oscillator 86, clock-synchronizing AND gate 84, and NOR gate 82 allows. When either of external control signals OFFV+B or OFFV–B is high, NOR gate 82 drives ENB low through AND gate 84, enabling oscillation of oscillator 86. Oscillator 86 pulses clock CLK to switch control 88. Another external control signal, V+NV–, directs switch control 88 to charge either the V+ or V– output.

Switch control 88 has six outputs S2, S4, S8, S9, S9B, and S10B that control switches inside charge pump 90 to selectively change connections of capacitors CV+ 42, C1 40, C2 44 and CV– 46. Charge pump 90 is connected to the power supply and has four outputs connected to capacitors used in the charging and voltage transfer phases. Outputs V+ is referenced to ground by capacitor CV+ 42, while output V– is connected to ground through capacitor CV– 46. Signals C1+ and C1– connect to the positive and negative plates of capacitor C1 40, while C2+ and C2– connect to capacitor C2 44. These capacitors are charged and discharged during the four phases described in FIG. 4.

Figure 7:
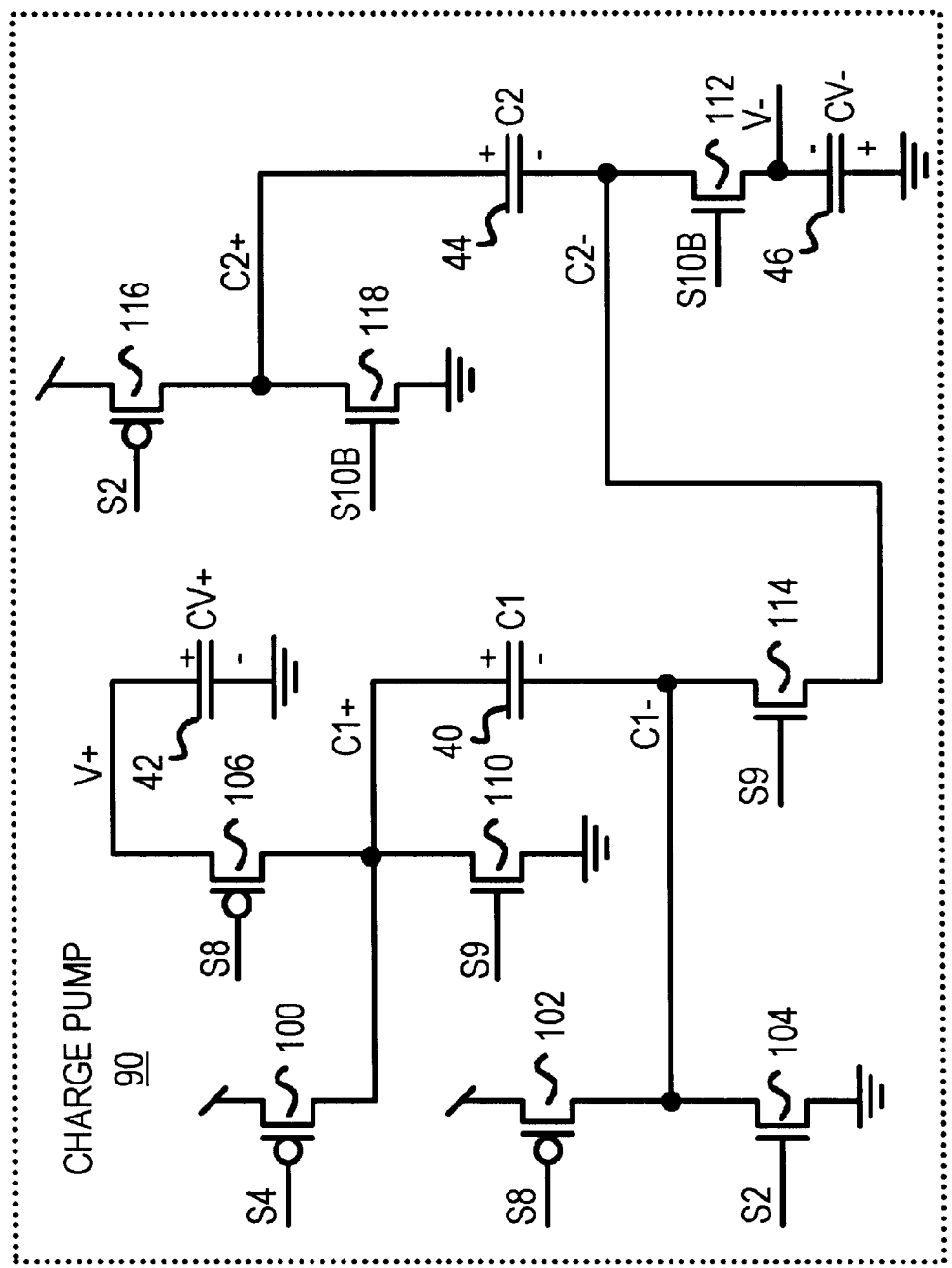
FIG. 7 shows circuitry inside the dual 2-phase charge pump shown in FIG. 6.

FIG. 7 shows circuitry inside the dual 2-phase charge pump shown in FIG. 6. Charge pump 90 uses capacitors 40, 42, 44, 46 to pump charge to outputs V+ and V–. Signals S2, S4, S8, S9, S9B, and S10B control transistors 100, 102, 104, 106, 110, 112, 114, 116, 118 to connect capacitors CV+ 42, C1 40, C2 44, CV– 46 as described for the four phases of FIG. 4.

During phase 2+, S4 is low, p-channel transistor 100 is turned on and Vcc is connected to side C1+ of capacitor C1 40. At the same time S2 is high, enabling ground to be connected to the other side C1– of capacitor C1 40 through n-channel transistor 104. The voltage across capacitor C1 40 is thus equal to Vcc in phase 2+.

When charge pump 90 switches to phase 1+, signal S8 goes low and Vcc is connected through p-channel transistor 102 to the negative plate C1– of capacitor C1 40. At the same time S8 is low to turn on p-channel transistor 106 to connect the positive plate of capacitor CV+ 42 to the positive plate C1+ of capacitor C1 40. This action charges capacitor CV+ 42 to V+=2Vcc.

During phase 2–, capacitor C1 40 is again charged to a value equal to Vcc through transistors 100, 104 with S4 low and S2 high. When charge pump 90 switches to phase 1–, signal S9 goes high to activate n-channel transistor 110 to apply a ground potential on the positive plate C1+ of capacitor C1 40. At the same time signal S9 is driven high to enabled n-channel transistor 114 to connect the negative plate C2– of capacitor C2 44 to the negative plate C1– of capacitor C1 40. This action charges capacitor C2 44 to a potential equal to 2Vcc.

When charge pump 90 switches back to phase 2–, signal S10B goes high to activate n-channel transistor 118 to connect ground to the positive plate C2+ of capacitor C2 44.

At the same time the high signal S10B enables n-channel transistor 112 to connect the negative plate C2– of capacitor C2 44 to the negative plate of capacitor CV– 46. This action forces capacitor C2 44 to transfer its charge to capacitor CV– 46. The result is V–=–2Vcc.

During phase 1+, transistors 102, 106 are on while other transistors are off. This drives the negative plate of capacitor C1 40 to Vcc and connects capacitors C1 40 and CV+ 42.

During phase 2+, transistors 100, 104 are on and all other transistors are off. This places Vcc on the positive plate of capacitor C1 40 and grounds the negative plate.

During phase 1–, transistors 110, 114, 116 are on while other transistors are off. This drives the positive plate of capacitor C1 40 to ground and connects capacitors C1 40 and C2 44. The positive plate of capacitor C2 44 is connected to power by p-channel transistor 116.

During phase 2–, transistors 100, 104 112, 118 are on and all other transistors are off. This places Vcc on the positive plate of capacitor C1 40 and grounds the negative plate. Also, the positive plate of capacitor C2 44 is grounded and the negative plate of capacitor C2 44 is connected to the negative plate of capacitor CV– 46.

Figure 8:
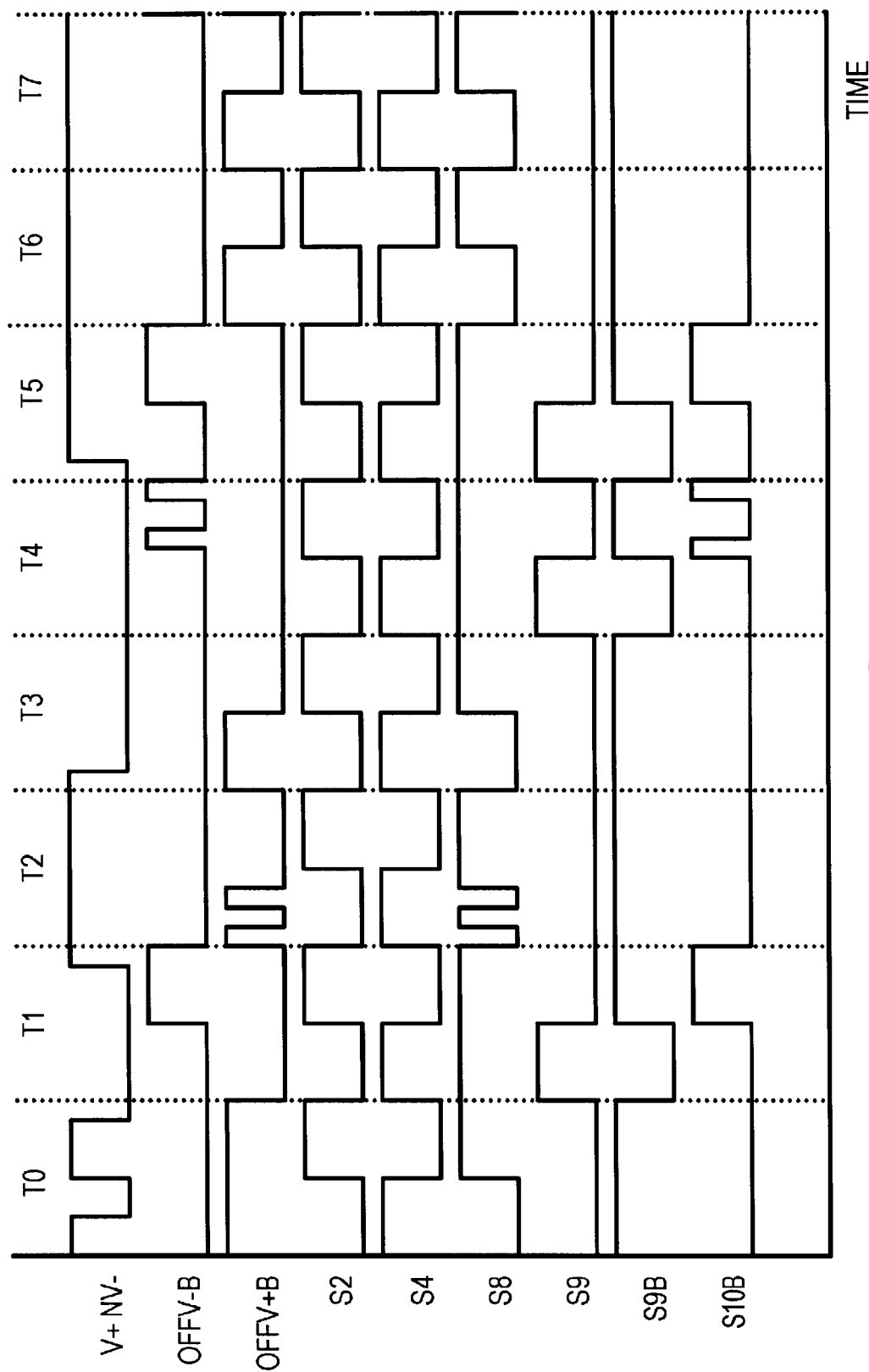
FIG. 8 is a timing diagram of control and switch signals.

FIG. 8 is a timing diagram of control and switch signals. Signals V+NV–, OFFV–B, OFFV+B are input to switch control 88 (FIG. 6), which generates switch-control signals S2, S4, S6, S9, S9B, and S10B. As switch control signals S2, S4, S6, S9, S9B, and S10B change state, the NMOS and PMOS transistors described in FIG. 7 switch on and off to change capacitor configurations in charge pump 90 and charge V+ and V– to their appropriate potentials.

When control signal V+NV– is high, V+ is selected for pumping, while when low V– is selected. Control signal OFFV+B is set high to enable V+ pumping, while OFFV–B is set high to enable V– pumping.

Figure 9:
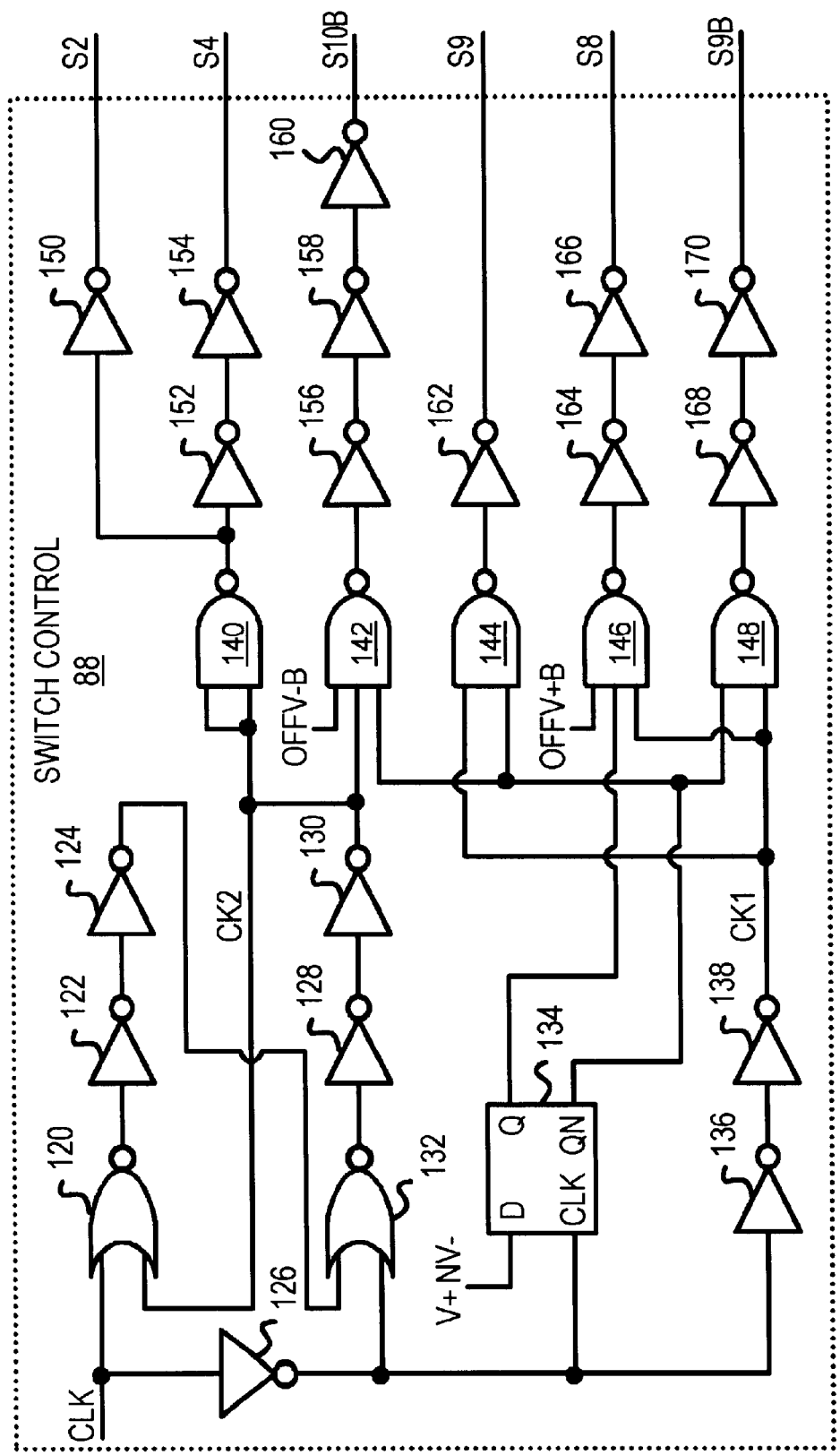
FIG. 9 shows the internal switch control circuitry.

FIG. 9 shows the internal switch control circuitry. Switch control 88 has three blocks for clocking, pump-enabling and, switch-driving circuitry. NOR gate 120 and inverters 122, 124 make up one-half of the clocking circuit. NOR gate 132 and inverters 128, 130 make up the other half of the clocking circuit. Together they form a cross-coupled S-R latch with CLK as an input, and CK2 as an output.

Inverter 126 inverts CLK to CLKB and drives NOR gate 132, flip-flop 134 and inverters 136, 138. The output of inverter 138, CK1, provides switch driver timing to NAND gates 144, 148. Switch signals S9 and S9B are generated through inverters 162, 168, 170. Switch signals S9, S9B are activated when direction signal V+NV– is low and latched into flip-flop 134, indicating that V– is being pumped.

The output of inverter 130, CK2, provides switch driver timing to NAND gates 140, 142. The output of NAND gate 140 is connected to the input of inverters 150, 152. Inverter 150 is generates S2, the charge pump clock. Inverter 152 drives inverter 154. Inverter 154 generates S4, the complement of the clock S2.

NAND gate 142 drives a chain of inverters 156, 158, 160 that make up a timing delay path for signal S10B. NAND gate 144 is connected to inverter 162 and NAND gate 148 is connected to inverters 168, 170 which generate signal S9 and its complement S9B. Output signal S8 is derived from NAND gate 146 and inverters 164, 166.

Inputs V+NV–, OFFV–B and OFFV+B control output timing for S2, S4, S8, S9, S9B and S10B. Input and output signal timing is shown in FIG. 8. Output clock signals S2, S4 operate continuously. However, outputs S10B and S8 function only when input control signals OFFV–B or OFFV+B remain high. Outputs S10B, S8, S9 and S9B are clocked by signal CK1 from inverter 138 and their outputs are also controlled by input control signal V+NV− through the complementary outputs of flip-flop 134.

When input control signals OFFV+B and OFFV−B are both LOW, charge pump outputs S10B and S8 to stop changing state and remain in the phase 2 idle state. When either OFFV+B or OFFV−B goes high, the charge pump enables output S10B or S8 to function and V+ or V− begins to charge in phase 1+ or 1−. The charge pump puts a positive charge on V+ when control signals OFFV+B and V+NV− are both set high. The charge pump puts a negative charge on V− when control signal OFFV−B is set high and control signal V+NV− goes low.

If both of the V+, V− outputs need to be charged, control signals OFFV+B and OFFV−B are set high and control signal V+NV− is pulsed high and low to charge V+ and V− in an alternating sequence. This cycle continues until the charge pump senses the appropriate positive charge on V+ or until the charge pump senses the appropriate negative charge on V− and stops charging to avoid exceeding set voltage limits.

Figure 10:
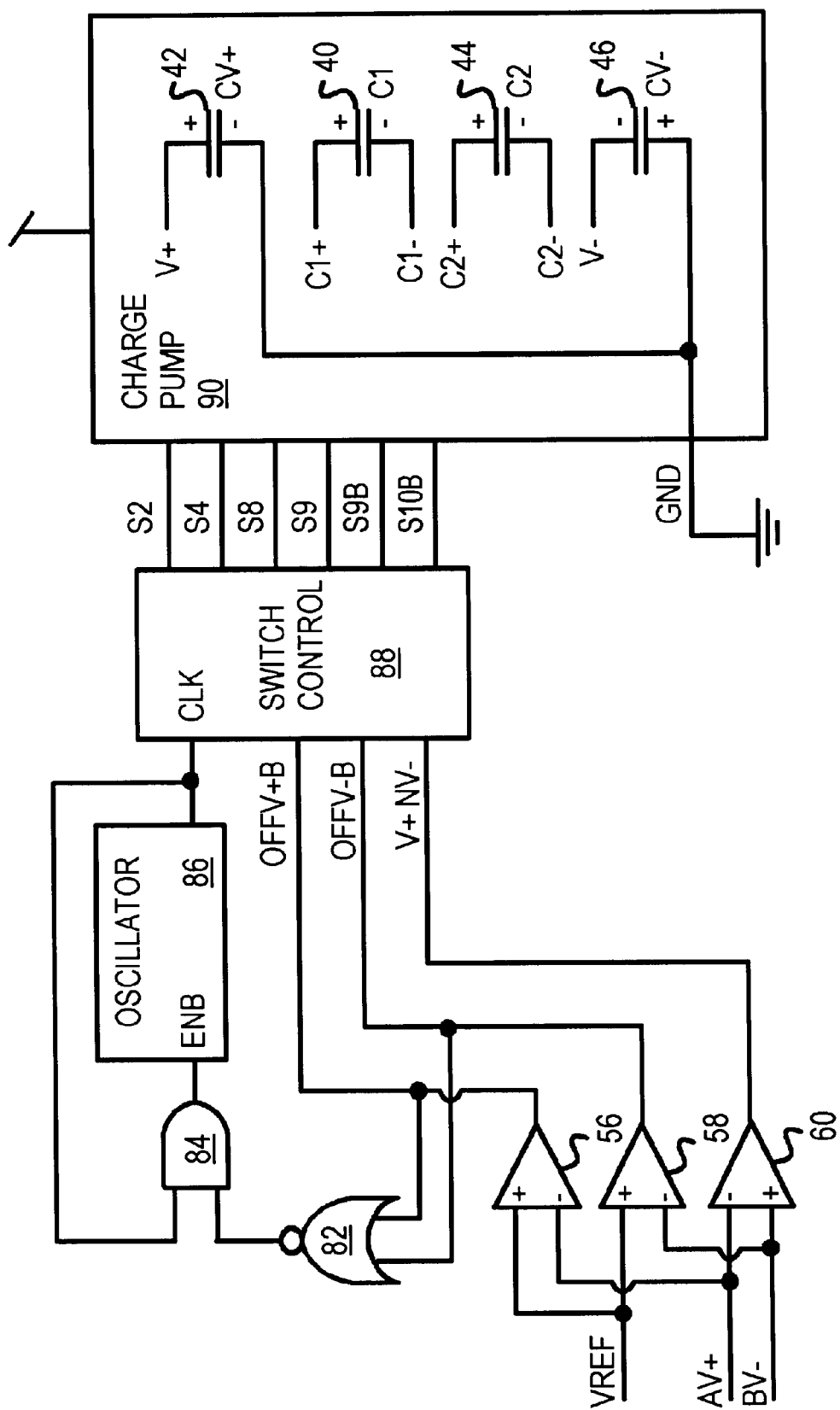
FIG. 10 shows an alternate embodiment with unequal positive and negative amplitudes.

FIG. 10 shows an alternate embodiment with unequal positive and negative amplitudes. NOR gate 82, AND gate 84, oscillator 86, switch control 88, and charge pump 90 are described For FIG. 6. This embodiment of the invention has three additional comparators 56, 58, 60 that control inputs to switch control 88. Comparators 56, 58 have a variable voltage reference VREF connected to one of their inputs. There are two external analog voltages AV+ and BV− that are connected to comparators 56, 58, 60. The combination of a variable VREF and analog voltages AV+ and BV− allows control switch 88 to activate charge pump 90 to begin and end charge cycles that result in unequal values of V+ and V−.

Reference voltage VREF is a pre-set voltage reference. Input AV+ is the product of the absolute value of output voltage |V+| and a coefficient A. Input BV− is the product of the absolute value of |V−| and a coefficient B. AV+ and BV− are compared by comparator 60 to generate output V+NV−. By changing the coefficients of AV+ and BV−, charge pump 90 can produce unequal bipolar voltages with V+=VREF/A and V−=VREF/B. For example, if an unequal value A|V+|>B|V−| is applied to comparators 56, 58, 60, then charge pump 90 continues to charge output V− until the ratio between outputs V+ and V− is equal to the ratio of inputs A|V+| to B|V−|. If an unequal value A|V+|<B|V−| is applied to comparators 56, 58, 60, then charge pump 90 continues to charge output V+ until the ratio between outputs V+ and V− are equal to the ratio of inputs A|V+| to B|V−|.

There are a number of advantages to this invention. The current invention can charge outputs V+ and V− so that |V+|=|V−|, |V+|>|V−|, |V+|<|V−| with unequal outputs. Another advantage is that this charge pump can charge individual outputs V+ or V−, depending on load demand, reducing energy use. Also, this design is more efficient because it does not need to charge both V+ and V− in a continuous sequential manner.

Alternate Embodiments

Another embodiment of this device can be for use in generation of sine waves. If smaller output capacitors are utilized and a faster clock implemented, then the V+ and V− outputs could be made to step in smaller increments that appear to be sinusoidal. This type of charge pump could be useful for hand held devices that require low power AC voltages. The output capacitors could be load capacitors and be external to the other circuitry. Capacitors could include several capacitors in parallel.

Yet another embodiment of this device could be for to generating multiple precision voltage references. Many computer systems contain large power supplies that require a small precision voltage reference circuit to regulate the output of the power drivers. In some cases there are multiple regulators to control different output voltages in the same system supply. The current invention could be expanded to control a number of precision voltage references all from a single integrated circuit chip.

Various circuit implementations are possible, and different timing signals could be generated and still achieve dual 2-phase timing. The sizes of transistors and capacitors can be adjusted to minimize secondary effects such as charge loss due to capacitive coupling. The actual voltages produced may be somewhat less than the ideal voltages of +2Vcc and −2Vcc due to charge and current losses and parasitic devices.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A dual two-phase charge pump comprising:

a first transfer capacitor;

a second transfer capacitor;

a first output capacitor, between a first output and a ground;

a second output capacitor, between a second output and the ground;

positive phase control logic for charging the first transfer capacitor during a second positive phase, and for coupling the first transfer capacitor to the first output capacitor during a first positive phase to generate a boosted positive voltage on the first output;

negative phase control logic for charging the first transfer capacitor during a second negative phase, and for coupling the first transfer capacitor to the second transfer capacitor during a first negative phase, and for coupling the second transfer capacitor to the second output capacitor during the second negative phase to generate a boosted negative voltage on the second output;

a first comparator, for comparing the first output to a first reference voltage to generate a first activation signal to the positive phase control logic when a voltage of the first output is below the first reference voltage; and a second comparator, for comparing the second output to a second reference voltage to generate a second activation signal to the negative phase control logic when a magnitude of a voltage of the second output is less than the second reference voltage, whereby the boosted negative voltage and the boosted positive voltage are generated by separate output capacitors and whereby charge transfer using the positive phase control logic and the negative phase control logic is separately activated by the voltage comparisons.

2. The dual two-phase charge pump of claim 1 further comprising:

a first coupling transistor, in the positive phase control logic, between the first transfer capacitor and the first output, the first coupling transistor being activated to conduct during the first positive phase by the positive phase control logic;

a second coupling transistor, in the negative phase control logic, between the first transfer capacitor and the second transfer capacitor, the second coupling transistor being activated to conduct during the first negative phase by the negative phase control logic; and a third coupling transistor, in the negative phase control logic, between the second transfer capacitor and the second output, the third coupling transistor being activated to conduct during the second negative phase by the negative phase control logic.

3. The dual two-phase charge pump of claim 2 wherein the positive phase control logic further comprises:

first driver means for driving a positive plate of the first transfer capacitor high during the second positive phase and during the second negative phase, and for driving the positive plate of the first transfer capacitor low during the first negative phase;

and wherein the negative phase control logic further comprises:

second driver means for driving a negative plate of the first transfer capacitor low during the second positive phase and during the second negative phase, and for driving the positive plate of the first transfer capacitor high during the first positive phase; and third driver means for driving a positive plate of the second transfer capacitor low during the second negative phase, and for driving the positive plate of the second transfer capacitor high during the first negative phase.

4. The dual two-phase charge pump of claim 3 wherein the first, second, and third driver means each comprise a pull-up transistor to a power supply and a pull-down transistor to the ground.

5. The dual two-phase charge pump of claim 1 wherein the first transfer capacitor has a positive plate coupled to a power supply during the second positive phase and during the second negative phase and a negative plate coupled to the ground during the second positive phase and during the second negative phase;

wherein during the first positive phase the positive phase control logic couples the negative plate of the first transfer capacitor to the power supply, and couples the positive plate of the first transfer capacitor to the first output;

wherein during the first negative phase the negative phase control logic couples the positive plate of the first transfer capacitor to the ground, and couples the negative plate of the first transfer capacitor to a negative plate of the second transfer capacitor and couples a positive plate of the second transfer capacitor to the power supply;

wherein during the second negative phase the negative phase control logic couples the negative plate of the second transfer capacitor to the second output and couples the positive plate of the second transfer capacitor to the ground;

whereby charge is transferred from the first transfer capacitor to the second transfer capacitor to generate the second output.

6. The dual two-phase charge pump of claim 5 wherein the first reference voltage and the second reference voltage are different voltages;

wherein the first output and the second output are driven to voltages having different magnitudes, whereby positive and negative output voltages are asymmetric.

7. The dual two-phase charge pump of claim 6 wherein the positive phase control logic remains idle in the second positive phase when the positive phase control logic is not activate by the first comparator;

wherein the negative phase control logic remains idle in the second negative phase when the negative phase control logic is not activated by the second comparator.

8. A dual-polarity charge pump comprising:

an oscillator enabled to pulse a clock when a positive output voltage is below a positive reference voltage, and when a negative output voltage is less negative than a negative reference voltage;

a switch controller, receiving the clock from the oscillator, for generating timing control signals;

a primary generating capacitor having a first primary terminal and a second primary terminal, the primary generating capacitor blocking direct current flow between the first primary terminal and second primary terminal;

a secondary generating capacitor having a first secondary terminal and a second secondary terminal, the secondary generating capacitor blocking direct current flow between the first secondary terminal and second secondary terminal;

a positive output capacitor coupled between a positive output node and a ground, the positive output node having the positive output voltage thereon;

a negative output capacitor coupled between a negative output node and the ground, the negative output node having the negative output voltage thereon;

a coupling transistor coupled between the primary generating capacitor and the secondary generating capacitor, for conducting current between the second primary terminal and the second secondary terminal;

a first output transistor coupled between the primary generating capacitor and the positive output capacitor, for conducting current between the first primary terminal and the positive output node;

a second output transistor coupled between the secondary generating capacitor and the negative output capacitor, for conducting current between the second secondary terminal and the negative output node;

a first comparator, receiving the positive reference voltage and the positive output voltage, for generating a first enable signal to the oscillator when the positive output voltage is below the positive reference voltage;

a second comparator, receiving the negative reference voltage and the negative output voltage, for generating a second enable signal to the oscillator when the negative output voltage is less negative than the negative reference voltage;

a first driver for driving the first primary terminal high and low in response to the timing control signals from the switch controller;

a second driver for driving the first secondary terminal high and low in response to the timing control signals from the switch controller; and a third driver for driving the second primary terminal high and low in response to the timing control signals from the switch controller, whereby positive and negative output voltages are generated across the positive and negative output capacitors.

9. The dual-polarity charge pump of claim 8 wherein the switch controller cycles one or more times through a sequence of a first positive phase and a second positive phase in response to the clock when the positive output voltage is below the positive reference voltage;

wherein the switch controller cycles one or more times through a sequence of a first negative phase and a second negative phase in response to the clock when the negative output voltage is less negative than the negative reference voltage, whereby the switch controller has four phases.

10. The dual-polarity charge pump of claim 9 wherein the coupling transistor receives a timing control signal from the switch controller causing the coupling transistor to conduct during the first negative phase but not conduct during other phases;

wherein the first output transistor receives a timing control signal from the switch controller causing the first output transistor to conduct during the first positive phase but not conduct during other phases; and wherein the second output transistor receives a timing control signal from the switch controller causing the second output transistor to conduct during the second negative phase but not conduct during other phases.

11. The dual-polarity charge pump of claim 10 wherein the first driver receives the timing control signals from the switch controller causing the first driver to drive the first primary terminal high during the second positive phase and during the second negative phase and to drive the first primary terminal low during the first negative phase;

wherein the second driver receives the timing control signals from the switch controller causing the second driver to drive the first secondary terminal high during the first negative phase and to drive the first secondary terminal low during the second negative phase;

wherein the third driver receives the timing control signals from the switch controller causing the third driver to drive the second primary terminal high during the first positive phase and to drive the second primary terminal low during the second positive phase and during the second negative phase.

12. The dual-polarity charge pump of claim 11 wherein the first driver comprises a p-channel transistor with a source connected to a power supply for driving the first primary terminal high and a n-channel transistor with a source connected to the ground for driving the first primary terminal low;

wherein the second driver comprises a p-channel transistor with a source connected to the power supply for driving the first secondary terminal high and a n-channel transistor with a source connected to the ground for driving the first secondary terminal low;

wherein the third driver comprises a p-channel transistor with a source connected to the power supply for driving the second primary terminal high and a n-channel transistor with a source connected to the ground for driving the second primary terminal low.

13. The dual-polarity charge pump of claim 12 wherein the coupling transistor is an n-channel transistor;

wherein the first output transistor is an n-channel transistor;

wherein the second output transistor is an n-channel transistor.

14. The dual-polarity charge pump of claim 13 further comprising:

a third comparator, receiving the positive output voltage and the negative output voltage, for generating a direction signal indicating when the positive output voltage is larger than a magnitude of the negative output voltage, wherein the direction signal is input to the switch controller.

15. The dual-polarity charge pump of claim 14 wherein the positive reference voltage and the negative reference voltage have a same magnitude, whereby the positive and negative outputs voltages are pumped toward symmetric target voltages.

16. The dual-polarity charge pump of claim 14 wherein the positive reference voltage and the negative reference voltage have different magnitudes, whereby the positive and negative outputs voltages are pumped toward asymmetric target voltages.

17. A dual-polarity multi-phase charging circuit comprising:

first capacitance means for coupling charge between a first node and a second node;

second capacitance means for coupling charge between a third node and a fourth node;

first output capacitance means for storing charge to generate a first output voltage on a first output node;

second output capacitance means for storing charge to generate a second output voltage on a second output node;

first connecting transistor means for directly connecting the second node to the third node in response to a first-negative-phase signal;

first output transistor means for directly connecting the first node to the first output node in response to a first-positive-phase signal;

second output transistor means for directly connecting the third node to the second output node in response to a second-negative-phase signal;

first restore means for restoring a high voltage onto the first node in response to a second-positive-phase signal and in response to the second-negative-phase signal;

second restore means for restoring a low voltage onto the second node in response to the second-positive-phase signal and in response to the second-negative-phase signal;

first compare means for comparing the first output voltage to a first reference voltage to alternately generate the first-positive-phase signal and the first-negative-phase signal when the first output voltage is below the first reference voltage; and second compare means for comparing the second output voltage to a second reference voltage to alternately generate the second-positive-phase signal and the second-negative-phase signal when a magnitude of the second output voltage is less than the second reference voltage, wherein the first output voltage is a positive voltage and the second output voltage is a negative voltage.

18. The dual-polarity multi-phase charging circuit of claim 17 further comprising:

first pull-down transistor means for driving the first node low in response to the first-negative-phase signal;

first pull-up transistor means for driving the second node high in response to the first-positive-phase signal;

second pull-up transistor means for driving the fourth node high in response to the first-negative-phase signal;

second pull-down transistor means for driving the fourth node low in response to the second-negative-phase signal.

* * * * *